(12) United States Patent
Kwak et al.

(10) Patent No.: US 10,375,858 B2
(45) Date of Patent: Aug. 6, 2019

(54) ELECTRONIC/ELECTRICAL COMPONENT HOUSING WITH STRIPS OF METAL PLATE AND SHAPE MEMORY MATERIAL FORMING A HEAT TRANSFER PATH

(71) Applicant: Hyundai Motor Company, Seoul (KR)

(72) Inventors: Jin Woo Kwak, Gyeongsangbuk-do (KR); Kyong Hwa Song, Seoul (KR); Byung Sam Choi, Gyeonggi-Do (KR); Han Saem Lee, Seoul (KR)

(73) Assignee: Hyundai Motor Company, Seoul (KR)

( * ) Notice: Subject to any disclaimer, the term of this patent is extended or adjusted under 35 U.S.C. 154(b) by 214 days.

(21) Appl. No.: 15/442,894

(22) Filed: Feb. 27, 2017

(65) Prior Publication Data
US 2017/0172013 A1   Jun. 15, 2017

Related U.S. Application Data

(62) Division of application No. 13/592,619, filed on Aug. 23, 2012, now Pat. No. 9,603,288.

(30) Foreign Application Priority Data

Apr. 23, 2012   (KR) .................. 10-2012-0041947

(51) Int. Cl.
*H01M 10/625* (2014.01)
*H01M 10/6551* (2014.01)
(Continued)

(52) U.S. Cl.
CPC ....... *H05K 7/20454* (2013.01); *G05D 23/024* (2013.01); *H01M 10/625* (2015.04);
(Continued)

(58) Field of Classification Search
CPC .......... H05K 7/20454; H05K 7/20436; H05K 7/20854; H01M 10/658; H01M 10/625;
(Continued)

(56) References Cited

U.S. PATENT DOCUMENTS 3,959,762 A * 5/1976 Senor .................. H01H 81/02
337/102
4,054,939 A   10/1977 Ammon
(Continued)

FOREIGN PATENT DOCUMENTS

JP   59-118829   7/1984
JP   06-278235   10/1994
(Continued)

*Primary Examiner* — Ula C Ruddock
*Assistant Examiner* — Matthew W Van Oudenaren
(74) *Attorney, Agent, or Firm* — Mintz Levin Cohn Ferris Glovsky and Popeo, P.C.; Peter F. Corless

(57) ABSTRACT

Disclosed is a housing for electronic/electrical that includes an inner panel and an outer panel, a strip of metal plate, and a strip of shape memory material. The inner panel and the outer panel are disposed parallel to each other at regular intervals to define an internal space. The strip of metal plate extends from an inner surface of the outer panel. The strip of shape memory material extends from an inner surface of the inner panel and is attached or detached to/from the metal plate on the outer panel while changing into an original straight shape or a bent shape according to a temperature variation. Here, when the temperature increase beyond a first transition temperature, the shape memory material straightens to form a heat transfer path. At a low temperature environment, the shape memory material bends and is separated from the metal plate to interrupt the heat transfer path.

6 Claims, 4 Drawing Sheets

(51) Int. Cl.
  *H01M 10/658* (2014.01)
  *H05K 7/20* (2006.01)
  *G05D 23/02* (2006.01)

(52) U.S. Cl.
  CPC ..... *H01M 10/658* (2015.04); *H01M 10/6551* (2015.04); *H05K 7/20436* (2013.01); *H05K 7/20854* (2013.01); *H01M 2220/20* (2013.01)

(58) Field of Classification Search
  CPC .......... H01M 10/6551; H01M 2220/20; G05D 23/024
  See application file for complete search history.

(56) References Cited

U.S. PATENT DOCUMENTS

| | | |
|---|---|---|
| 4,772,777 A | 9/1988 | Weller et al. |
| 5,318,108 A | 6/1994 | Benson et al. |
| 5,570,739 A | 11/1996 | Krawchuk et al. |
| 5,813,454 A | 9/1998 | Potter |
| 5,844,464 A | 12/1998 | Kalapodis et al. |
| 5,879,832 A | 3/1999 | Vu et al. |
| 5,898,356 A | 4/1999 | Gascoyne et al. |
| 5,997,465 A | 12/1999 | Savage et al. |
| 5,998,051 A | 12/1999 | Poirier et al. |
| 6,005,469 A | 12/1999 | Kalapodis et al. |
| 6,018,286 A | 1/2000 | Quinn et al. |
| 6,025,080 A | 2/2000 | Soroushian |
| 6,037,071 A | 3/2000 | Poirier et al. |
| 6,191,679 B1 | 2/2001 | Kalapodis et al. |
| 6,278,607 B1 * | 8/2001 | Moore ................ G06F 1/203 361/679.54 |
| 6,342,826 B1 | 1/2002 | Quinn et al. |
| 7,892,630 B1 | 2/2011 | McKnight et al. |
| 2005/0099776 A1 | 5/2005 | Xue et al. |
| 2009/0162748 A1 | 6/2009 | Fan et al. |
| 2011/0135986 A1 * | 6/2011 | Qiu ................ H01M 2/1077 429/120 |
| 2013/0171487 A1 * | 7/2013 | Bull ................ H01M 2/1077 429/99 |
| 2013/0180563 A1 | 7/2013 | Makansi |

FOREIGN PATENT DOCUMENTS

| | | |
|---|---|---|
| JP | 2007-258548 | 10/2007 |
| JP | 2009-207336 | 9/2009 |
| JP | 2009207336 * | 9/2009 |
| KR | 10-2003-0053238 | 6/2003 |
| KR | 10-2005-0064749 | 6/2005 |

* cited by examiner

ELECTRONIC/ELECTRICAL COMPONENT HOUSING WITH STRIPS OF METAL PLATE AND SHAPE MEMORY MATERIAL FORMING A HEAT TRANSFER PATH

CROSS-REFERENCE TO RELATED APPLICATION

This application is a Divisional application of U.S. application Ser. No. 13/592,619 filed Aug. 23, 2012 which claims under 35 U.S.C. § 119(a) the benefit of Korean Patent Application No. 10-2012-0041947 filed Apr. 23, 2012, the entire contents of which are incorporated herein by reference.

BACKGROUND (a) Technical Field

The present invention relates to a housing for covering electronic/electrical components. More particularly, the present invention relates to a housing using a shape memory material which can actively control thermal conductivity in response to ambient temperature environments.

(b) Background Art

Generally, examples of electronic/electrical components generating a large amount of heat include Central Processing Units (CPUs), thermoelectric elements, power transistors, and batteries. These electronic/electrical components are accompanied by heat generation due to the intrinsic characteristics of materials and the electrical resistances occurring within connection portions between components.

With the development of electronic technology, electronic/electrical components are being further enhanced in their performance, are becoming faster in the processing speed, and are decreasing in their size. However, as the processing speed of components each having an equal area increases in proportion to the development of technology, thus more thermal energy is generated from the inside of components as a result.

Heat generated in these components shorten the lifespan of components, and/or deteriorates their functions, and often affects adjacent components as a result. In severe cases, heat may cause malfunction or data processing failures. Accordingly, various methods for effectively controlling heat generated in electronic/electrical components are being proposed.

For example, a housing using a composite containing filler with high thermal conductivity has been used to overcome heat generation limitations in electronic/electrical components for vehicles, particularly, battery systems. However, heat radiating composites have a limited thermal conductivity (e.g., about 10 W/mk to about 30 W/mk (injection direction) according to recent reports. Also, in components that are manufactured via an injection method, anisotropy of heat conduction occurs due to orientation of filler in the injection direction, and the thermal conductivity in the thickness direction is very low, one third to one fourth of that in the injection direction.

For effective heat radiation, the heat transfer path needs to be formed in accordance with the shape and characteristics of components. Thus, sufficient heat radiation effect can be achieved by convection, and most housing components can improve the heat radiation efficiency through the improvement of heat transfer characteristics in the thickness direction.

Also, a reduction in the performance of batteries may occur based on the actual use environments (temperature). Generally, the thermal runaway may occur in batteries that are operating in a high temperature environment, and the output reduction of batteries may frequently occur in a low temperature environment.

Some heat controlling materials have been developed from only one perspective, "heat radiation," and are focused toward the improvement of thermal conductivity. When, however, heat insulation is needed, separate foaming or plastic materials with low thermal conductivity are used to manufacture a housing.

Thus, there are currently no materials on the market that can dynamically deal with different environmental fluctuations which may require heat insulation and/or heat radiation. That is, when heat insulation is excellent, heat radiation is deficient, and when heat radiation is excellent, heat insulation is deficient due to high thermal conductivity.

On solution is to provide a housing that is manufactured using a thermal insulator, and a blower is utilized or coolant is applied to the housing to enhance the heat radiation performance, causing the increase of the total weight. In order to overcome the above limitations, development of a housing material that can dynamically control heat conduction according to ambient environments and reduction in weight is needed.

The above information disclosed in this Background section is only for enhancement of understanding of the background of the invention and therefore it may contain information that does not form the prior art that is already known in this country to a person of ordinary skill in the art.

SUMMARY OF THE DISCLOSURE

The present invention provides a housing for electronic/electrical components using a shape memory material, which can provide an efficient heat radiation effect by increasing the thermal conductivity of the housing materials when heat is generated due to operation of devices and increase of ambient temperature, and can fundamentally prevent performance reduction of components by rapidly reducing the thermal conductivity of the housing materials when the ambient temperature decreases, thus serving as a thermal insulator.

In one aspect, the present invention provides a housing for electronic/electrical components using a shape memory material, including: an inner panel and an outer panel that are disposed parallel to each other at regular intervals to define an internal space; a strip of metal plate extending from an inner surface of the outer panel; and a strip of shape memory material extending from an inner surface of the inner panel and attached or detached to/from the metal plate on the outer panel while changing into an original straight shape or a bent shape according to a temperature variation. When the temperature of an internal heat source rises, the shape memory material forms a heat transfer path while being straightened to contact the metal plate, and at a low temperature environment, the shape memory material is bent and separated from the metal plate to interrupt the heat transfer path.

In some exemplary embodiments, the metal plate and the shape memory material may be orthogonal to the panels, and may form or interrupt the heat transfer path in the thickness direction of the housing. Additionally, both or either the metal plate and/or the shape memory material may include a heat conductive coating layer formed thereon.

In still another exemplary embodiment, the metal plate and the shape memory material may be disposed in a plurality of pairs along all surfaces of the housing at regular intervals. The housing may also include different types of shape memory materials having different transition temperatures to set different heat conductions on different portions of the housing. Furthermore, the internal space defined by the inner panel and the outer panel may be filled with a foaming material with low thermal conductivity to act as an additional insulation means.

Other aspects and exemplary embodiments of the invention are discussed infra.

BRIEF DESCRIPTION OF THE DRAWINGS

The above and other features of the present invention will now be described in detail with reference to certain exemplary embodiments thereof illustrated the accompanying drawings which are given hereinbelow by way of illustration only, and thus are not limitative of the present invention, and wherein.

Figure 1:
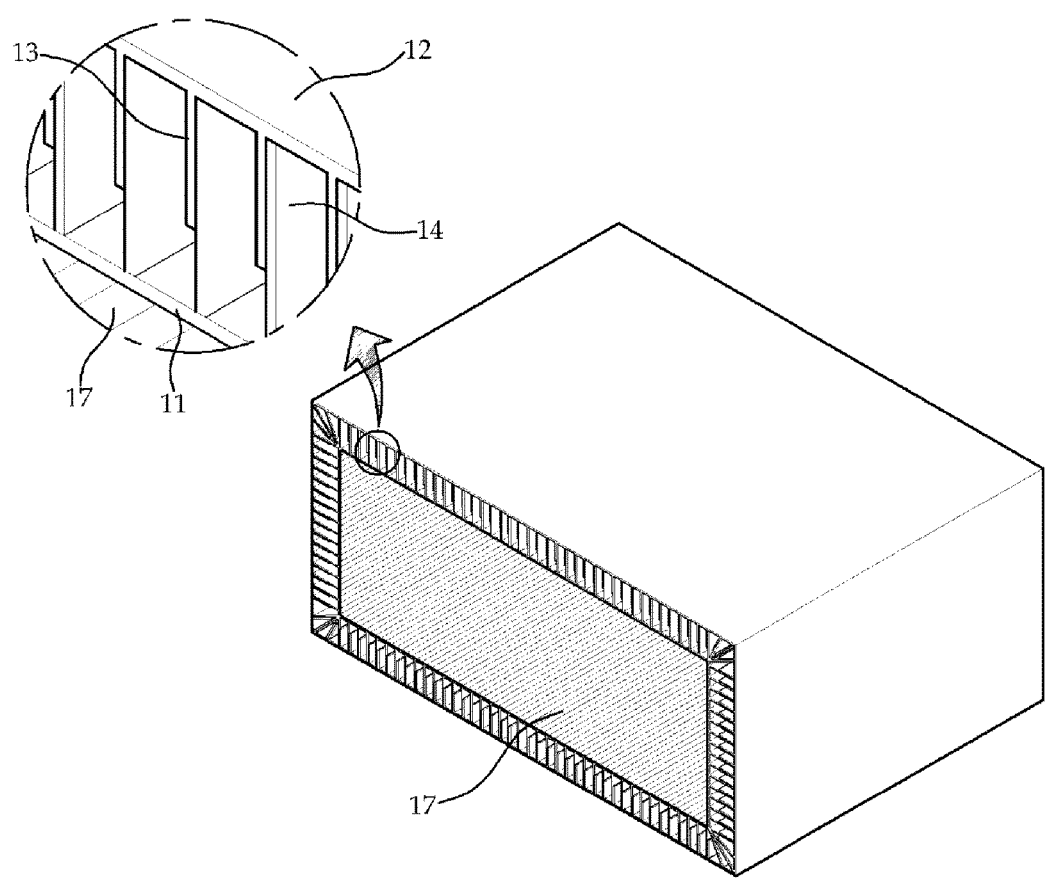
FIG. 1 is a cross-sectional perspective view illustrating a housing of an electronic/electrical component using a shape memory material according to an exemplary embodiment of the present invention.

Reference numerals set forth in the Drawings includes reference to the following elements as further discussed below:

10: internal space
11: inner panel
12: outer panel
13: metal plate
14: shape memory material
15a, 15b: heat conductive coating layer
16: filler
17: internal heat source It should be understood that the appended drawings are not necessarily to scale, presenting a somewhat simplified representation of various preferred features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Hereinafter reference will now be made in detail to various embodiments of the present invention, examples of which are illustrated in the accompanying drawings and described below. While the invention will be described in conjunction with exemplary embodiments, it will be understood that present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuels derived from resources other than petroleum). As referred to herein, a hybrid vehicle is a vehicle that has two or more sources of power, for example both gasoline-powered and electric-powered vehicles.

The above and other features of the invention are discussed infra.

Hereinafter, exemplary embodiments of the present invention will be described in detail with reference to the accompanying drawings.

Figure 2:
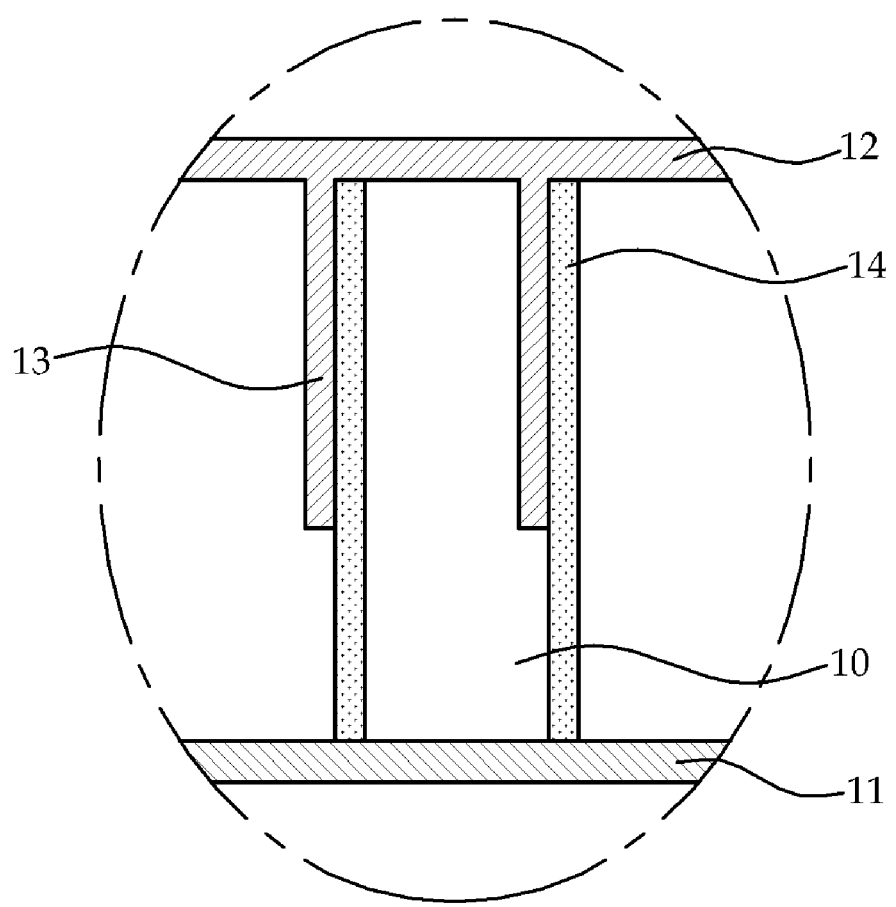
FIG. 2 is a magnified cross-sectional view illustrating an exemplary arrangement of a metal plate and a Shape Memory Material (SMM) plate in a housing of an electronic/electrical component using a shape memory material according to an exemplary embodiment of the present invention.
Figure 3:
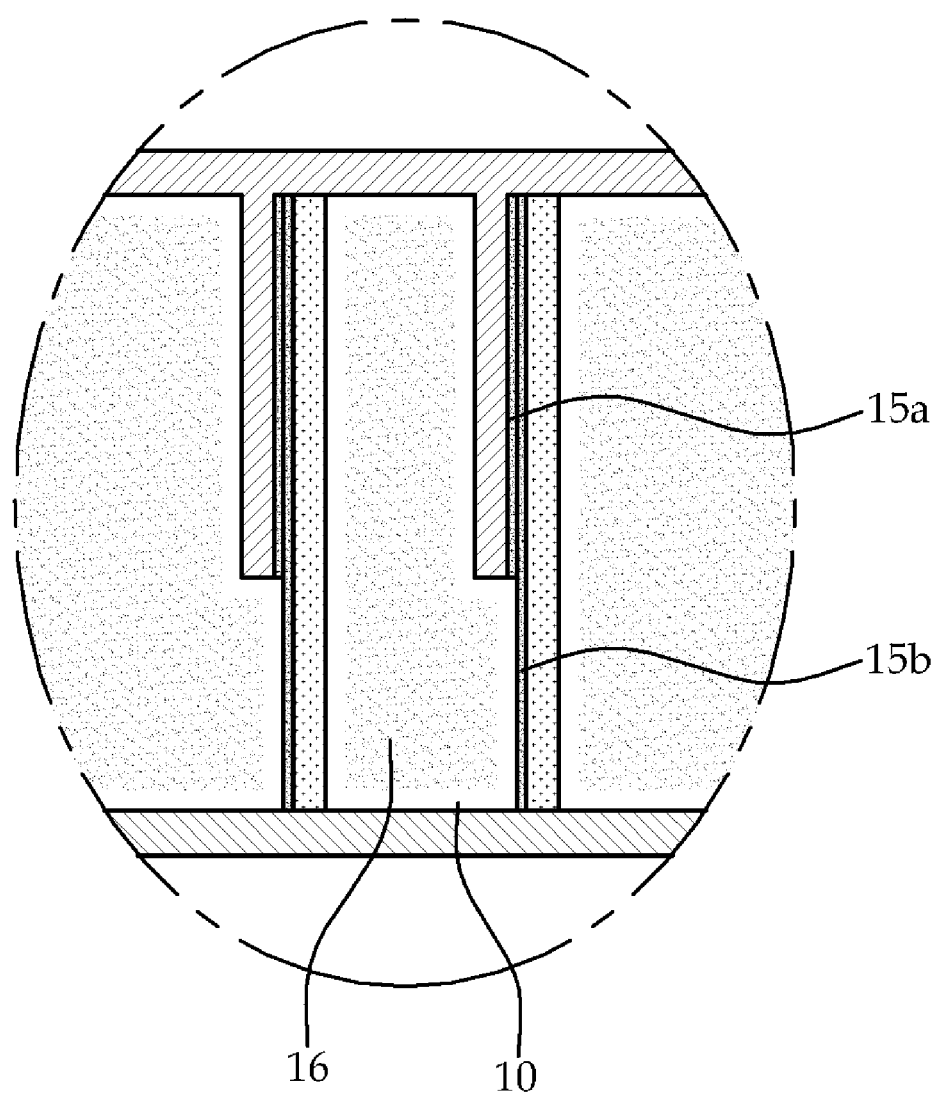
FIG. 3 is a magnified cross-sectional view illustrating another exemplary arrangement of a metal plate and an SMM plate in a housing of an electronic/electrical component using a shape memory material according to an exemplary embodiment of the present invention.

FIG. 1 is a cross-sectional perspective view illustrating a housing of an electronic/electrical component using a shape memory material according to an embodiment of the present invention. FIGS. 2 and 3 are magnified cross-sectional views illustrating different arrangements of metal plates and Shape Memory Material (SMM) plates in a housing of an electronic/electrical component using a shape memory material according to an exemplary embodiment of the present invention As shown in FIGS. 1 through 3, a housing using a shape memory material which can actively control thermal conductivity according to ambient temperature environments is disclosed.

For example, the energy and output of typical lithium ion batteries is rapidly reduced when the temperature falls below −10° C. In particular, it has been reported that batteries supply only 5% of the energy density and 1.25% of the power density in an environment of −40° C. compared to an environment of 20° C. Also, it has been reported that lithium ion batteries show normal discharging but abnormal charging under low temperature environments.

The reduction of the battery performance under low temperature environments may cause low ion conductivity of electrolytes, solid electrolyte membranes formed on the surface of graphite, low diffusion of lithium ions into graphite, and an increase in the transfer resistance at an interface between the electrolyte and the electrodes. For this reason, a separate heat insulating system may be needed to maintain a battery cell within an optimum temperature range of about 35° C. to about 45° C.

Accordingly, a battery system needs to be maintained within an appropriate temperature range of about 35° C. to about 50° C. to prevent the reduction of battery performance according to variations in external temperatures especially if those batteries are going to be used in cold weather environments, e.g., car batteries. With a material proposed in the present invention, the battery system can be maintained within an appropriate temperature range under a low temperature environment while maintaining sufficient heat radiation performance during typical climate conditions.

A housing according to an exemplary embodiment of the present invention may include aluminum with a sufficient thermal conductivity (e.g., above about 230 W/mk) and a shape memory material (SMM). Additionally, a heat conductive coating layer formed of, for example, graphite may be formed on both the aluminum material and the SMM material to increase thermal conductivity. The housing may be formed of aluminum which can provide heat insulation and thermal conductivity control by being manufactured in a form which can form and interrupt a heat transfer path according to various temperature environments together with an air layer therein.

The aluminum in the housing is connected to the shape memory material in the shape of an aluminum plate as shown below.

Figure 4:
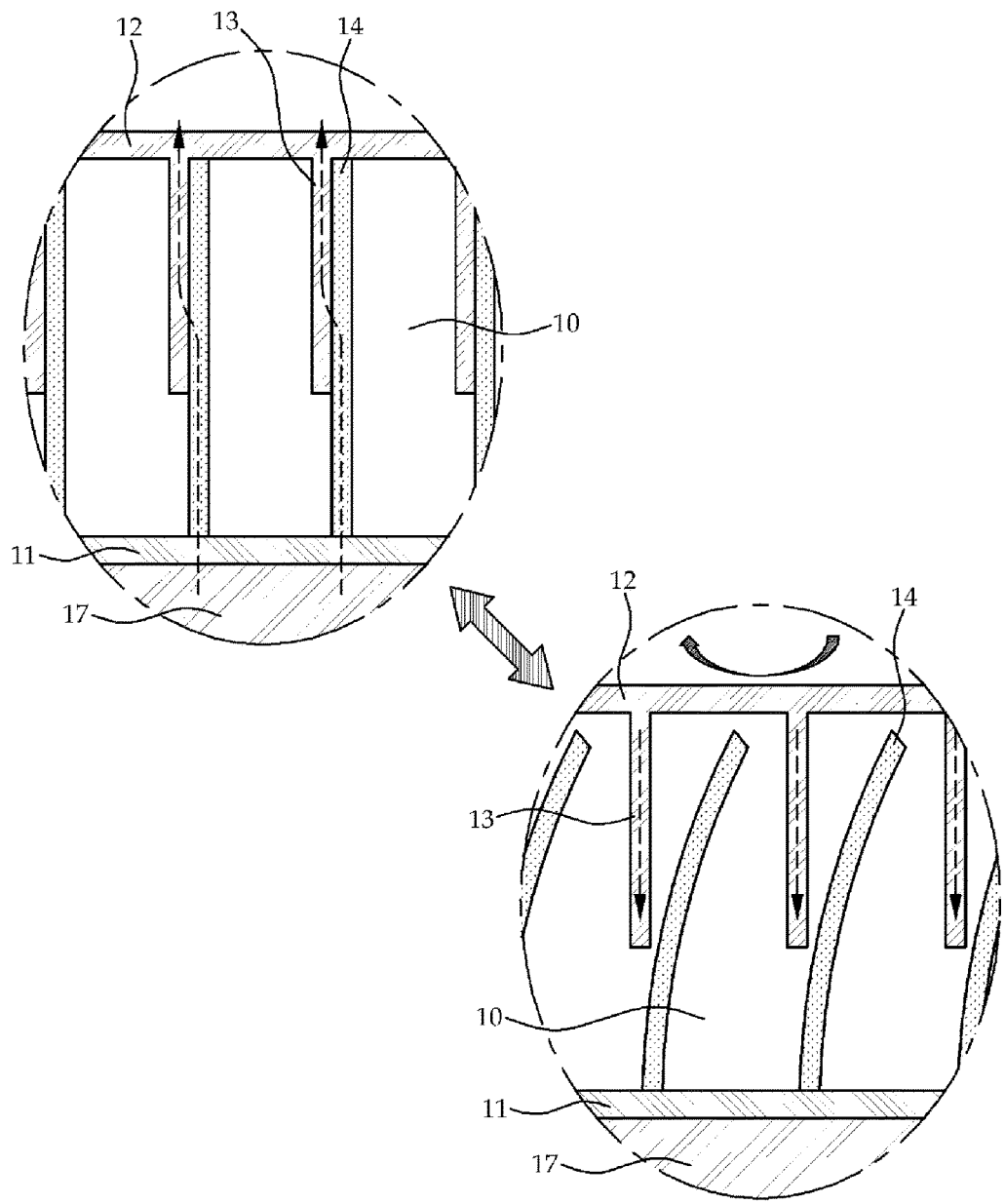
FIG. 4 is a cross-sectional view illustrating heat radiation and heat insulation of a metal plate and an SMM plate in a housing of an electronic/electrical component using a shape memory material according to an exemplary embodiment of the present invention.

Aluminum has excellent heat conductivity. As shown in FIGS. 2-4, the material consists of (i) aluminum (an upper plate, a bottom plate, and a plate which is connected to the upper plated and stretched downwardly therefrom) (ii) shape memory material(which is connected to the bottom plate and stretched upwardly therefrom), and preferably (iii) a heat conductive coating layer (coated on one of the two plates (upper plate or bottom plate). In particular, the plate which is connected to the upper plate and stretched downwardly therefrom is an aluminum plate coated with graphite, whereas the plate which is connected to the bottom plate and stretched upwardly therefrom is a shape memory material plate coated with graphite.

With regard to heat insulation and thermal conductivity in connection with the above described embodiment, when the two plates separate (as shown in FIG. 4) it serves the insulation function, while when they are connected (as shown in FIG. 3) it increases thermal conductivity.

For this, the housing may house an internal heat source 17 such as a battery, and may include an inner panel 11 and an outer panel 12 which define a space unit 10. The inner panel 11 and the outer panel 12 may be disposed parallel to each other over a certain interval to define the internal space 10. Here, the inner panel 11 and the outer panel 12 may be formed of an aluminum material which is capable of providing both heat insulation and thermal conductivity control.

Also, a plurality of pillars (not shown) may be disposed between the inner panel 11 and the outer panel 12 to maintain an air layer which is embodied as the internal space 10. The pillars may be formed of plastics such as polyamide, polypropylene, and polycarbonate with low thermal conductivity so as not to interrupt the heat insulation effect under a low temperature environment. The inner panel 11 and the outer panel 12 may be provided with a metal plate 13 and a shape memory material 14 which are attached and detached to/from each other to form and interrupt a heat transfer path.

For example, the metal plate 13 may be formed of an aluminum material, and the shape memory material 14 may be formed of various materials. In this case, the metal plate 13 and the shape memory material 14 may be formed to have a ribbon shape, for example, a thin plate of a strip shape. The metal plate 13 may extend from the inner surface of the outer panel 12, and the shape memory material 14 may extend from the inner surface of the inner panel 11 by a certain length, respectively.

In particular, the metal plate 13 may be formed of an aluminum plate with a width of about 8 mm to about 12 mm, which is the same material as the outer panel 12. The metal plate 13 may straightly extend from the outer panel 12 toward the inner panel 11, but may be maintained at a predetermined distance from the inner panel 11. The shape memory material 14 is capable of returning to its original shape or changing into a bent shape based on the temperature variation in the environment in which is housed and may have the same width as the metal plate 13.

In this case, the metal plate 13 and the shape memory material 14 may be formed integrally with the panels, or may be separately formed on the panels by welding. Here, the metal plate 13 and the shape memory material 14 may be orthogonal to the panels, forming or interrupting a heat transfer path in the thickness direction of the housing.

Also, the shape memory material 14 may be formed of various kinds of shape memory alloys (SMA) or shape memory polymers (SMP) according to the characteristics of components such as the thermal conductivity and the operating temperature. Here, the phase transition temperature of SMA may be variously adjusted from about −250° C. to about 200° C. according to the composition of an alloy. Generally, since the phase transition temperature can be adjusted from −100° C. to about 100° C., SMA can be formed to have a composition in accordance with the housing temperature control.

When SMP or SMA with low thermal conductivity is used, the section of the shape memory material 14 or both the metal plate 13 and the shape memory material 14 may be coated, laminated, or attached with SMP or SMA to increase the thermal conductivity at contact surfaces therebetween and thus minimize the heat transfer resistance. For this, both or either of the metal plate 13 and the shape memory material 14 may include a heat conductive coating layer 15 for improving the thermal conductivity.

In this case, examples of available heat conductive coating layer 15 may include graphite paper (above about 200 W/mk), metal paste (about 10 W/mK to about 20 W/mk), and aluminum plate (about 200 W/mk to about 230 W/mk) with the same size. Accordingly, the shape memory material 14 on the inner surface of the inner panel 11 may be attached or detached to/from the metal plate 13 while changing into the original straight shape or other bent shapes according to temperature variation. When the temperature of the internal heat source increases, the shape memory material 14 may be straightened to contact the metal plate 13 and thus form a heat transfer path. On the other hand, at a low temperature environment, the shape memory material 14 may be bent to be detached from the metal plate 13 and thus interrupt the heat transfer path.

For example, the thermal energy from the internal heat source may be transferred to the shape memory material 14 through the inner aluminum panel with sufficient thermal conductivity, and when the temperature reaches the transition temperature of the shape memory material 14, the shape memory material 14 may be straightened into the original shape, contacting the metal plate 13 extending from the outer panel 12 and thus forming the heat transfer path.

The metal plate 13 and the shape memory material 14 may be arranged in multiple or a plurality of pairs at regular intervals along the surfaces of the housing, for example, the upper and lower faces, the right and left faces, the front and rear faces of the housing that is in the shape of a cuboid. For example, a pair of metal plate 13 and shape memory material 14 disposed on the upper surface of the housing may be disposed along the length direction of the housing while being perpendicular to the thickness direction of the housing. The pairs of metal plate 13 and shape memory material 14 may be disposed at regular intervals along the width direction of the housing as well. Particularly, a customized heat conduction controlling housing can be implemented by combining various kinds of shape memory material 14 in a single housing to locally vary heat conduction accordingly.

In other words, different types of shape memory material 14 having different transition temperatures may be locally disposed in one housing to provide varying heat conduction accordingly. Thus, since different types of shape memory material 14 can be partially disposed to set different heat conductions on different portions of the housing, heat radiation can be appropriately achieved according to the heat generation characteristics of various components of the internal heat source. Also, the thermal conductivity can be freely controlled according to the selection of the shape memory material.

The internal space 10 between the inner panel 11 and the outer panel 12 may serve as an air layer, or may be filled with a filler 16 formed of a foaming material. For example, the aluminum housing may include an air layer between the inner panel 11 and the outer panel 12, or the filler 16 such as foam with low thermal conductivity filled therein. The filler 16 may be designed in consideration of the size and shape of components. In order to increase the durability of components, the filler 16 may be filled in portions other than portions where the metal plate 13 and the shape memory material 14 are located. Here, the foam may be filled in consideration of the switching operation radius of the shape memory material 14 so as not to interrupt the switching operation of the shape memory material 14.

Accordingly, as shown in FIG. 4, when the temperature rises up due to internal heat sources such as electronic/electrical components or battery systems, the thermal energy may be transferred to the shape memory material 14 through the internal aluminum panel 11 with excellent thermal conductivity. Also, when the temperature reaches a transition temperature of the shape memory material 14, the shape memory material 14 may be become straightened, thereby contacting the metal plate 13 extending from the outer panel 12 and thus forming a heat transfer path. Since the heat transfer path may be formed in the thickness direction of the housing, heat can be effectively transferred to the outer panel 12 and then radiated through convection due to external cooling air.

The shape memory material 14 may be formed of various kinds of SMA and SMP according to the required characteristics, thermal conductivity, and optimum operating temperature of components. SMA may include copper-zinc-aluminum and nickel-titanium. The shape memory materials may have a one-way memory effect or a two-way memory effect according to the shape memory stage. In regards to a one-way memory effect, when a shape memory material is bent or stretched in a low temperature environment, the shape memory material may hold its deformed shape until heated above the predetermined transition temperature for that specific material. When heated above the transition temperature, the shape memory material may return to the original shape. When cooled again, the shape memory material may hold the shape of the heated state until deformed again.

The two-way memory effect refers to when the material "remembers" two different shapes, i.e., one at a low temperature and the other at a high temperature. A material that shows shape memory effects during both heating and cooling is called a two-way shape memory material. Accordingly, the two-way shape memory material may be applied without a separate external force. Since the two-way shape memory material can be controlled via just temperature, two-way shape memory material having a two-way memory effect may be applied to the present invention effectively.

Referring back to the shape of the material at various temperatures, at a low temperature below zero, the shape memory material may be bent and separated from the metal plate (switch-off). Thus, since a heat transfer path is not formed in this situation, the housing itself may serve as a thermal insulator, thereby preventing a reduction in the performance and power of an electronic/electrical component or a battery system. Since the housing according to the embodiment of the present invention is formed of a hollowed aluminum panel, the housing can contribute to reduction of the weight of component materials as well.

Also, the conductivity for heat radiation at a high temperature above a specific transition temperature may range from about 100 W/mk to about 230 W/mk, and the conductivity for heat insulation at a low temperature below the transition temperature may be maintained to be less than or equal to about 0.1 W/mk. Particularly, when viewed from the perspective of heat radiation, the housing according to the embodiment of the present invention has a very high in thermal conductivity compared to a typical composite material, and advantageous to control the heat conduction anisotropy.

Thus, since a housing according to an embodiment of the present invention is implemented using a shape memory material that allows the heat conduction characteristics of the housing to be dynamically controlled according to the ambient temperature, it is possible to dynamically control heat insulation and heat radiation under different environments while reducing the overall weight of the system at the same time.

A housing for electronic/electrical components using a shape memory material according to an embodiment of the present invention can also improve the stability of components, and can fundamentally solve performance reduction issues caused by heat, by adopting a material in which the heat conduction characteristics can be actively controlled according to the ambient temperature.

The invention has been described in detail with reference to exemplary embodiments thereof. However, it will be appreciated by those skilled in the art that changes may be made in these embodiments without departing from the principles and spirit of the invention, the scope of which is defined in the appended claims and their equivalents.

What is claimed is:

1. A method for controlling the temperature of a battery in an electric vehicle, the method comprising:
   in response to an ambient temperature of an internal heat source surrounded by a housing increasing beyond a first transition temperature, forming, by a shape memory material plate, a heat transfer path in an internal space between an inner panel and an outer panel formed in a housing for the battery by the shape memory material plate straightening due to the first transition temperature to contact a metal plate extending from an inner surface of the outer panel, and
   in response to the ambient temperature of the internal heat source falling below a second transition temperature, the shape memory material plate bending and separating from the metal plate to interrupt the heat transfer path and provide the battery with heat insulation,
   wherein the metal plate extends from the outer panel,
   wherein the shape memory material plate extends from the inner panel, and
   wherein the metal plate and the shape memory material plate are provided in a plurality of pairs.

2. The method of claim 1, wherein the metal plate is orthogonal to the inner and outer panels, and wherein the metal plate and the shape memory material plate both form and interrupt the heat transfer path between the inner panel and the outer panel of the housing depending upon the ambient temperature.

3. The method of claim 1, wherein both or either of the metal plate and the shape memory material plate comprises a heat conductive coating layer formed thereon.

4. The method of claim 1, wherein the plurality of pairs of the metal plate and the shape memory material plate are disposed within the internal space of the housing at predetermined intervals.

5. The method of claim 4, wherein the shape memory material plates have different transition temperatures to provide different heat conductivities at different portions of the housing.

6. The method of claim 1, wherein the internal space defined by the inner panel and the outer panel is filled with a foam having a thermal conductivity lower than a predetermined value.

* * * * *